United States Patent
Arvidsson

(10) Patent No.: US 8,803,531 B2
(45) Date of Patent: Aug. 12, 2014

(54) METHOD AND ARRANGEMENT FOR THROUGH-LINE MISMATCH RF TESTING

(75) Inventor: Lars Arvidsson, Kumla (SE)

(73) Assignee: Telefonaktiebolaget L M Ericsson (Publ), Stockholm (SE)

(*) Notice: Subject to any disclaimer, the term of this patent is extended or adjusted under 35 U.S.C. 154(b) by 574 days.

(21) Appl. No.: 13/130,266

(22) PCT Filed: Nov. 27, 2008

(86) PCT No.: PCT/SE2008/051361
§ 371 (c)(1),
(2), (4) Date: May 19, 2011

(87) PCT Pub. No.: WO2010/062229
PCT Pub. Date: Jun. 3, 2010

(65) Prior Publication Data
US 2011/0227592 A1      Sep. 22, 2011

(51) Int. Cl.
*G01R 27/04*    (2006.01)
*G01R 27/06*    (2006.01)

(52) U.S. Cl.
CPC ....................................... *G01R 27/06* (2013.01)
USPC ............................................ 324/632; 324/95

(58) Field of Classification Search
CPC .......... G01R 27/06; G01R 27/04; G01R 1/24; G01R 21/00
See application file for complete search history.

(56) References Cited

U.S. PATENT DOCUMENTS

| 2,454,042 | A | | 11/1948 | Dettinger | |
| 2,496,837 | A | * | 2/1950 | Woodyard | 333/24 R |
| 2,527,979 | A | * | 10/1950 | Woodward, Jr. | 324/630 |
| 2,534,437 | A | * | 12/1950 | Ginzton | 333/24 R |
| 2003/0107363 | A1 | | 6/2003 | Tsironis | |
| 2004/0119481 | A1 | | 6/2004 | Tsironis | |

FOREIGN PATENT DOCUMENTS

GB      1 323 496 A      7/1973

OTHER PUBLICATIONS

Coaxial Line Sensor for Measuring ,Complex Permittivity Lee Proceedings A. Physical Science, Measurement &Instrumentation. Management & Education, 1271980 1, vol. 139, No. 5, Sep. 1, 1992, pp. 261-264, XP000311459 ISSN: 0960-7641 the whole document.

* cited by examiner

*Primary Examiner* — Minh N Tang

(57) ABSTRACT

A method and arrangement for facilitating through-line mismatch RF testing using an air-isolated coaxial line having an inner conductor surrounded by a coaxial shielding. At least one circular opening is provided through the shielding. A radially adjustable piston is provided in each opening such that it is electrically connected to the shielding and such that its protrusion from an inside of the shielding towards the inner conductor is adjustable. The position of the radially adjustable piston is calibrated with a known level of RF mismatch so that a desired level of mismatch can be created through adjustment of the piston. By adjusting the piston so that it does not protrude beyond the inside of the shielding, the arrangement is effectively set to zero and does not have to be disconnected after use.

19 Claims, 5 Drawing Sheets

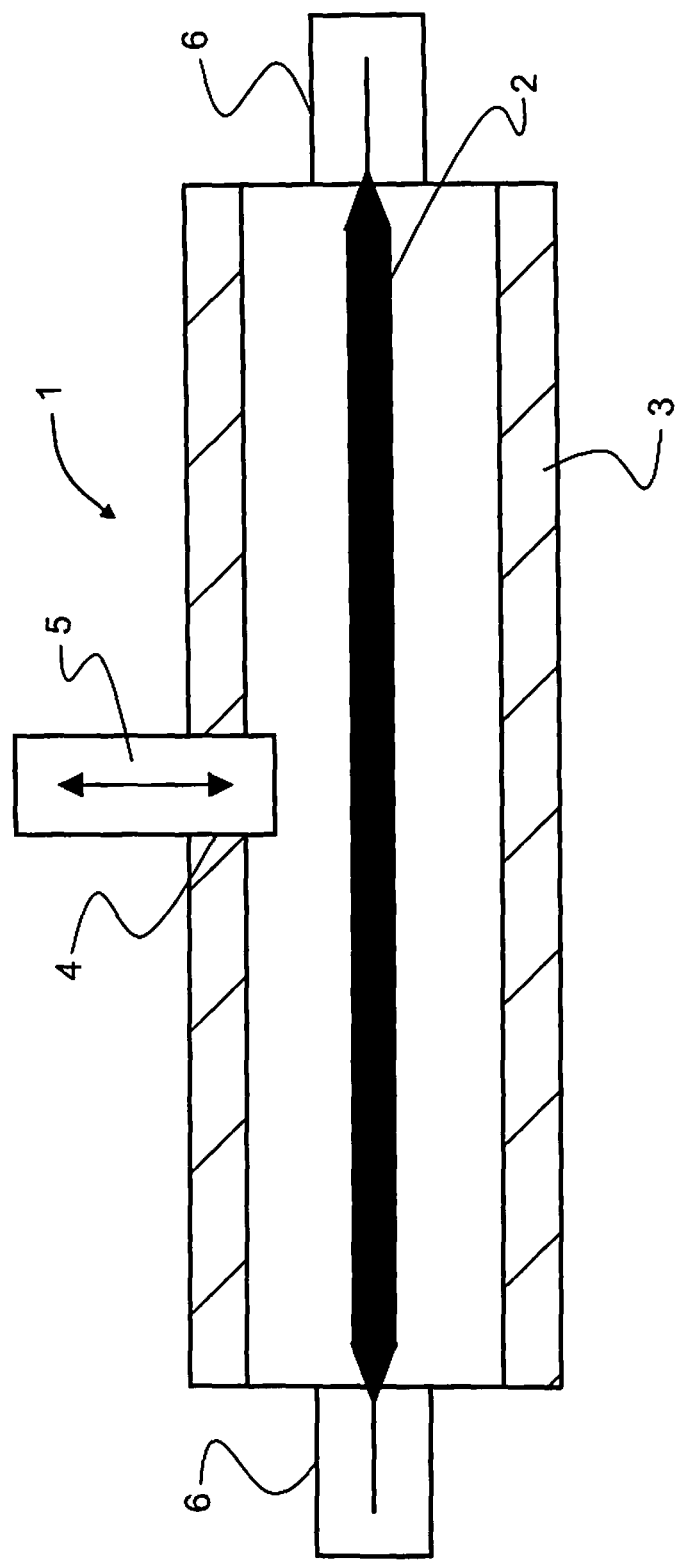

METHOD AND ARRANGEMENT FOR THROUGH-LINE MISMATCH RF TESTING

TECHNICAL FIELD

The present invention relates to a method and an arrangement for through-line mismatch RF testing and, more particular, to a method and an arrangement of facilitating through-line mismatch RF testing using an air-isolated coaxial line having an inner conductor surrounded by a coaxial shielding.

BACKGROUND

When a Radio Frequency (RF) transmitter is connected to an antenna by a feed line, the impedance of the antenna and feed line must match exactly for maximum energy transfer from the feed line to the antenna. If an antenna and a feed line do not have matching impedances, some of the electrical energy can not be transferred from the feed line to the antenna. Energy not transferred to the antenna is reflected back towards the transmitter. The interaction of these reflected waves with forward waves causes standing wave patterns. Reflected power in RF transmitters may cause an increase in RF energy losses and damage the RF transmitter.

In RF testing, normally pure resistive 50 ohms loads and cables are used. However, sometimes there is a need for a mismatch, for simulating a non-perfect load situation for a transmitter for instance. Such mismatches should of course be well defined and known.

For some purposes there is a need to adjust the mismatch both in reflection coefficient and phase. For that purpose, it is common to use sliding loads, adjustable stubs and similar equipment. Such equipment needs to be carefully adjusted for each frequency before insertion using a network analyzer.

More commonly, a broadband mismatch, such as a load having an impedance which is not equal to the system impedance may be used. Another approach is to use a through attenuator, leaving the output port either open or shorted. This gives a return loss of approximately twice the attenuators attenuation. Both of the last two methods described above only gives the possibility to control the magnitude of the reflection coefficient. This is often sufficient, for instance when characterizing a VSWR-detector (Voltage Standing Wave Ratio).

A VSWR (voltage standing wave ratio) detector measures the standing wave ratio in a transmission line and is used to check the quality of the match between the antenna and the transmission line.

The above described methods, however, suffer from a flaw that the port of the Device Under Test (DUT) has to be disconnected from other test equipment, for instance a power meter. If RF switch relays are used to switch a in a number of test devices to the DUT, the measurement accuracy will be compromised caused by mismatches and reflections. Positioning the mismatch behind relays and additional cables also gives a very uncertain result and makes an ever so well-defined mismatch device severely unpredictable, from the DUTs point of view.

SUMMARY

Accordingly, one objective with the present invention is to provide an improved method of facilitating through-line mismatch RF testing using an air-isolated coaxial line having an inner conductor surrounded by a coaxial shielding.

According to a first aspect of the present invention this objective is achieved through a method of facilitating through-line mismatch RF testing using an air-isolated coaxial line having an inner conductor surrounded by a coaxial shielding. The method comprises providing at least one opening through said shielding. The method further comprises providing a radially adjustable piston in each said opening such that it is electrically connected to said shielding and such that its protrusion from an inside of said shielding towards said inner conductor may be varied.

A further objective of the present invention is to provide an improved arrangement for through-line mismatch RF testing comprising an air-isolated coaxial line having an inner conductor surrounded by a coaxial shielding.

According to a second aspect of the present invention this further objective is achieved through an arrangement for through-line mismatch RF testing. The arrangement comprises an air-isolated coaxial line having an inner conductor surrounded by a coaxial shielding. The arrangement further comprises at least one opening through said shielding. The arrangement further comprises a radially adjustable piston in each said opening such that it is electrically connected to said shielding and such that its protrusion from an inside of said shielding towards said inner conductor may be varied.

Further embodiments are listed in the dependent claims.

Thanks to the provision of a method and arrangement, which allows for the addition of a controlled amount of mismatch to a transmission line by adding a capacitive load thereto and thereby lowering the impedance of the influenced part of the transmission line, and through making this capacitive load adjustable (down to zero influence), when the capacitive load is set to zero no influence may be seen and the transmission line may act as a through-line with high RF performance.

Still other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings, wherein like reference characters denote similar elements throughout the several views:

FIG. 1 illustrates a longitudinal section through an arrangement for through-line mismatch RF testing according to the present invention;

DETAILED DESCRIPTION

A method of facilitating through-line mismatch RF testing and an arrangement for through-line mismatch RF testing have been based on the realisation that one could add a controlled amount of mismatch to a transmission line by adding a capacitive load thereto and thereby lowering the impedance of the influenced part of the transmission line. Through making this capacitive load adjustable (down to zero influence), when the capacitive load is set to zero no influence may be seen and the transmission line may act as a through-line with high RF performance.

Initially will be described a method of facilitating through-line mismatch RF testing using an air-isolated coaxial line 1, as illustrated in FIG. 1, optionally having RF connectors 6 at each end thereof which are connected to the coaxial line 1. The air-isolated coaxial line 1 has an inner conductor 2 surrounded by a coaxial shielding 3. The coaxial shielding 3 is conductive, e.g. a metal shielding.

Figure 2A:
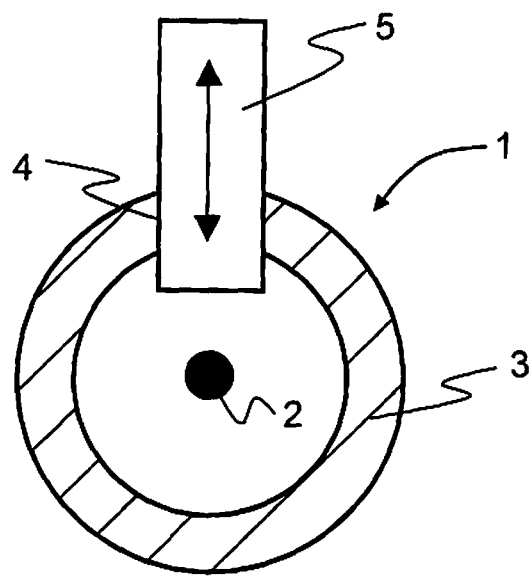
FIG. 2a illustrates a cross section through an arrangement in accordance with FIG. 1 with a piston protruding towards the inner conductor for adding mismatch.

In its most general form the method comprises the steps of: providing at least one opening 4 through the shielding 3; and providing a radially adjustable piston 5 in each opening 4 such that this piston 5 is electrically connected to the shielding 3 and such that this pistons protrusion, from an inside of the shielding 3 towards the inner conductor 2, may be varied. A cross section of such an arrangement is illustrated in FIG. 2a.

This may e.g. be achieved through drilling one, two or more holes 4 through the metal shielding 3. Thereafter radially adjustable pistons 5 are inserted into theses holes 4, one piston 5 into each hole 4. As mentioned above, the pistons 5 are electrically connected to the shielding 3.

In a further embodiment the method further comprises the step of arranging the radially adjustable piston 5 to be adjustable to a position aligned with the shielding 3 and such that no part thereof protrudes from the inside of the shielding 3. Such an arrangement is illustrated in FIG. 2b.

Thus, through withdrawing the piston 5 to a position aligned with the shielding 3, in the above described manner, the piston 5 will in this position act as part of the shielding 3, making the coaxial line 1 just a through-line.

Figure 2B:
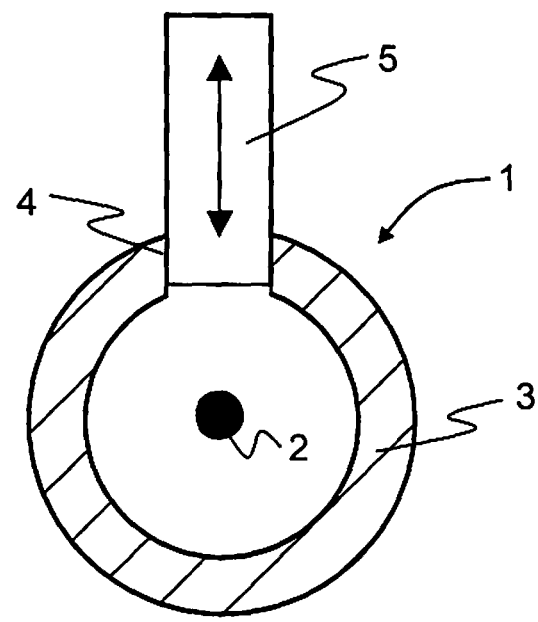
FIG. 2b illustrates a cross section through an arrangement in accordance with FIG. 1 with a piston aligned with the shielding adding no mismatch.

In case of the piston 5 having a plane surface facing the inner conductor 2, as illustrated in FIGS. 2a and 2b, the piston 5 should preferably be withdrawn to a position such that this plane surface facing the inner conductor 2 is aligned with a thought highest point of the curved shielding 3 as illustrated in FIG. 2b, i.e. such that a thought continuation of the curved inner surface of the shielding 3 would touch the centre of the plane surface facing the inner conductor 2 as the piston 5 has been brought to this position aligned with the shielding 3.

In yet a further embodiment the method further comprises the step of providing the radially adjustable piston 5 with a curved surface 5a facing the inner conductor 2. This curved surface 5a being given essentially the same curvature as the inside of the shielding 3. Such an arrangement is illustrated in FIGS. 3a and 3b.

Thus, through giving the curved surface 5a essentially the same curvature as the inside of the shielding 3 the coaxial line 1 is made an essentially lossless through-line through withdrawing the piston 5 to the position aligned with the shielding 3. This is illustrated in FIG. 3b.

Figure 3A:
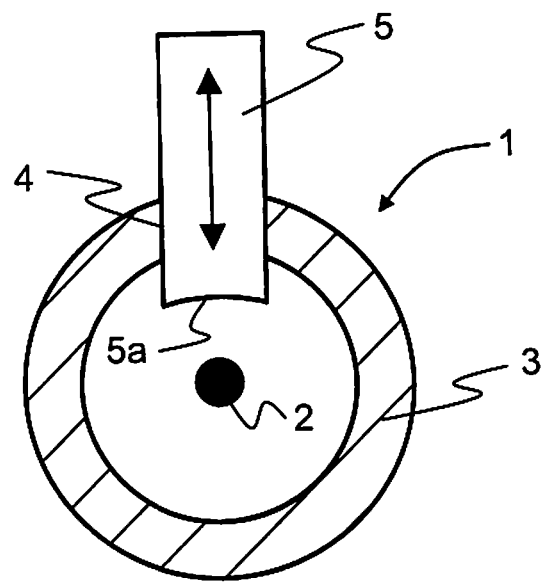
FIG. 3a illustrates an alternative embodiment of a cross section as in FIG. 2a where the piston has a curved surface facing the inner conductor.
Figure 3B:
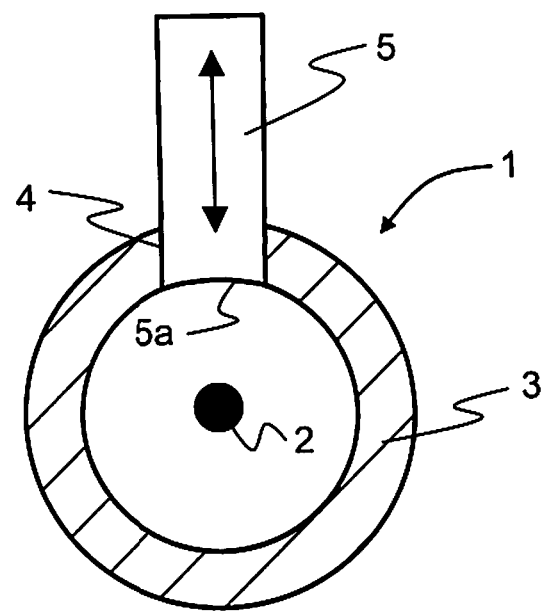
FIG. 3b illustrates an alternative embodiment of a cross section as in FIG. 2b where the piston has a curved surface aligned with the curved shielding.

Thus, in case of the piston 5 having a curved surface 5a facing the inner conductor 2, as illustrated in FIGS. 3a and 3b, the piston 5 should preferably be withdrawn to a position such that this curved surface 5a facing the inner conductor 2 is aligned with the curved shielding 3 as illustrated in FIG. 3b, i.e. such that a continuation of the curved inner surface of the shielding 3 is provided by the curved surface 5a facing the inner conductor 2 as the piston 5 has been brought to this position aligned with the shielding 3.

Figure 4A:
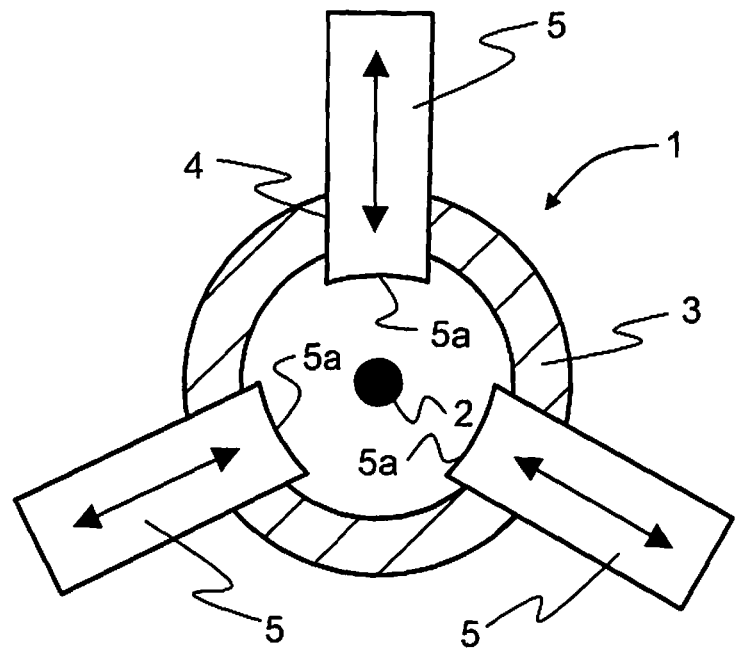
FIG. 4a illustrates a further alternative embodiment of a cross section as in FIG. 2a with three pistons having curved surfaces facing the inner conductor.

In a further alternative embodiment the method further comprises the step of providing three radially adjustable pistons 5 having curved surfaces 5a facing the inner conductor 2. These curved surfaces 5a are given essentially the same curvature as the inside of the shielding 3. For precision, it is preferred that the three (or more) pistons 5 are arranged in openings 4, where each opening 4 is provided circumferentially spaced at the same longitudinal position of the coaxial line 1. However, although favourable for precision, it is not necessary to align the openings 4 and thus pistons 5 circumferentially. Such an arrangement comprising three pistons 5 is illustrated in FIGS. 4a and 4b.

Figure 4B:
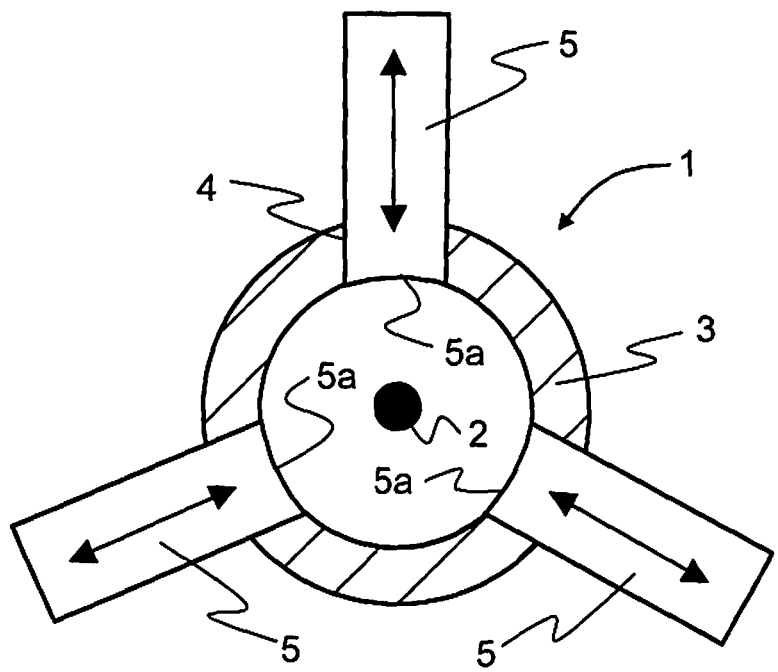
FIG. 4b illustrates a further alternative embodiment of a cross section as in FIG. 2b with three piston having a curved surfaces aligned with the curved shielding.

Thus, in the same manner as illustrated in FIG. 3b, through the curved surfaces 5a being given essentially the same curvature as the inside of the shielding 3 the coaxial line 1 will be made an essentially lossless through-line as the three pistons 5 are adjusted to positions aligned with the shielding 3, as illustrated in FIG. 4b.

It will be obvious to the person skilled in the art that the arrangement may be provided with an arbitrary number of pistons 5, i.e. one or more pistons 5. However, practical limitations will present themselves, especially when aligning the openings 4 and thus pistons 5 circumferentially.

It will further be obvious to the person skilled in the art that as an alternative embodiment the method may comprise the step of providing three radially adjustable pistons 5 having plane surfaces facing the inner conductor 2. Thus, in accordance with such an embodiment the three pistons 5 may be withdrawn to positions aligned with the shielding 3, in a similar manner to that which is illustrated in FIG. 2b, where the pistons 5 will act as part of the shielding 3, making the coaxial line 1 just a through-line.

In a still further embodiment the method further comprises the step of providing means 8 for radial adjustment of each piston 5.

In one further embodiment the method further comprises the step of providing as such means 8 for radial adjustment of each piston 5 at least one linear stepper motor.

In accordance with this further embodiment each piston 5 may be actuated with high precision, e.g. under the control of a test computer 9. It is also envisaged to use other electric actuators, e.g. a plain Direct Current (DC) motor with a suitable gearbox, in combination with a position read-back device or other similar actuators which are controllable to well defined positions.

In order to allow also for actuators providing for less well defined positioning in accordance with a still further embodiment the method further comprises the steps of providing a predetermined stop (not shown) for limiting the protrusion of each radially adjustable piston 5 from the inside of the shielding 3 towards the inner conductor 2, and providing as the means 8 for radial adjustment of each piston 5 at least one of: a mechanical actuator; an electro-magnetic actuator; a pneumatic actuator.

In order to facilitate selective variation in testing in a yet further embodiment the method further comprises the step of providing the predetermined stop as an adjustable stop.

A further embodiment of the method further comprises the step of arranging the predetermined stop to be adjustable by means of at least one adjustment screw (not shown).

Thus, through arranging the predetermined stop to be adjustable by means of at least one adjustment screw, providing firm stop positions for the radial movement of each piston 5, using actuators providing for less well defined positioning, e.g. such as electro-magnets or small pneumatic cylinders etc., it is possible to virtually instantaneously add or disconnect a predetermined amount of mismatch, selected using the adjustment screw(s). A set up as described here will provide for very fast measurements cycles in an automatic test station.

In accordance with the present invention is also envisaged an arrangement for through-line mismatch RF testing, as illustrated in FIG. 1, comprising an air-isolated coaxial line 1 optionally having RF connectors at each end thereof which are connected to the coaxial line 1. The air-isolated coaxial line 1 has an inner conductor 2 surrounded by a coaxial shielding 3. The coaxial shielding 3 is conductive, e.g. a metal shielding.

In its most general form the arrangement comprises at least one opening 4 through the shielding 3; and a radially adjustable piston 5 being provided in each opening 4 such that it is electrically connected to the shielding 3 and such that its protrusion from an inside of the shielding 3 towards the inner conductor 2 may be varied. The pistons 5 are electrically connected to the shielding 3.

In one embodiment of the arrangement, as illustrated by the cross sections of FIGS. 2a and 2b, the radially adjustable piston 5 is further adjustable to a position (FIG. 2b) aligned with the shielding 3 and such that no part thereof protrudes from the inside of the shielding.

Thus, when the piston 5 has been withdrawn to a position aligned with the shielding 3, in the above described manner and as illustrated in FIG. 2b, the piston 5 will in this position act as part of the shielding 3, making the coaxial line 1 just a through-line.

In case of the piston 5 having a plane surface facing the inner conductor 2, as illustrated in FIGS. 2a and 2b, the piston 5 should preferably be withdrawn to a position such that this plane surface facing the inner conductor 2 is aligned with a thought highest point of the curved shielding 3 as illustrated in FIG. 2b, i.e. such that a thought continuation of the curved inner surface of the shielding 3 would touch the centre of the plane surface facing the inner conductor 2 as the piston 5 is in the position aligned with the shielding 3.

In a still further embodiment of the arrangement, as illustrated by the cross sections of FIGS. 3a and 3b, the radially adjustable piston 5 further has a curved surface 5a facing the inner conductor 2. This curved surface 5a has essentially the same curvature as the inside of the shielding 3.

Thus, through the curved surface 5a having essentially the same curvature as the inside of the shielding 3 the coaxial line 1 is made an essentially lossless through-line when the piston 5 has been adjusted to the position aligned with the shielding 3, as illustrated in FIG. 3b.

In a further alternative embodiment of the arrangement, as illustrated by the cross sections of FIGS. 4a and 4b, three radially adjustable pistons 5 have curved surfaces 5a facing the inner conductor 2. These curved surfaces 5a have essentially the same curvature as the inside of the shielding 3. For precision, it is preferred that the three (or more) pistons 5 are arranged in openings 4, where each opening 4 is provided circumferentially spaced at the same longitudinal position of the coaxial line 1. However, although favourable for precision it is not necessary to align the openings 4 and thus pistons 5 circumferentially.

Thus, in the same manner as illustrated in FIG. 3b, through the curved surfaces 5a having essentially the same curvature as the inside of the shielding 3 the coaxial line 1 is made an essentially lossless through-line when the three pistons 5 have been adjusted to positions aligned with the shielding 3, as illustrated in FIG. 4b.

It will be obvious to the person skilled in the art that the arrangement may be provided with an arbitrary number of pistons 5, i.e. one or more pistons 5. However, practical limitations will present themselves, especially when aligning the openings 4 and thus pistons 5 circumferentially.

It will further be obvious to the person skilled in the art that as an alternative embodiment the arrangement may be provided with three radially adjustable pistons 5 having plane surfaces facing the inner conductor 2. Thus, in accordance with such an embodiment the three pistons 5 will, when withdrawn to positions aligned with the shielding 3, in a similar manner to that which is illustrated in FIG. 2b, act as part of the shielding 3, making the coaxial line 1 just a through-line.

In a yet further embodiment of the arrangement it comprises means 8 for radial adjustment of each piston 5.

In one further embodiment of the arrangement the means 8 for radial adjustment of each piston 5 comprises at least one linear stepper motor.

In accordance with this further embodiment each piston 5 may be actuated with high precision, e.g. under the control of a test computer 9. It is also envisaged to have other electric actuators, e.g. a plain DC motor with a suitable gearbox, in combination with a position read-back device or other similar actuators which are controllable to well defined positions.

In order to allow also for actuators providing for less well defined positioning in accordance with a still further embodiment of the arrangement the protrusion of each radially adjustable piston 5 from the inside of the shielding 3 towards the inner conductor 2 is further limited by a predetermined stop (not shown), and the means for radial adjustment 8 of each piston 5 comprises at least one of: a mechanical actuator; an electro-magnetic actuator; a pneumatic actuator.

In order to facilitate selective variation in testing in a yet further embodiment of the arrangement each predetermined stop is adjustable.

In one embodiment of the arrangement each predetermined stop is adjustable by means of at least one adjustment screw (not shown).

Thus, through arranging each predetermined stop to be adjustable by means of at least one adjustment screw, providing firm stop positions for the radial movement of each piston 5, using actuators 8 providing for less well defined positioning, e.g. such as electro-magnets or small pneumatic cylinders etc., it is possible to virtually instantaneously add or disconnect a predetermined amount of mismatch, selected using each adjustment screw. A set up as described here will provide for very fast measurements cycles in an automatic test station.

The mismatch arrangement may be characterized when calibrating the test station, using a network analyzer or similar equipment. Thereafter, the mismatch achieved for each piston 5 activated to protrude from an inside of the shielding 3 towards the inner conductor 2 to a firm stop position is known, or alternatively which position of a high precision positioning actuator, e.g. how many steps from the aligned zero position of the linear stepper actuator, or similar, that corresponds to a desired mismatch.

Thus, to quantify the added mismatch (VSWR, return loss) the device can be pre-calibrated using for instance a network analyzer, to adjust e.g. adjustable stopper screws, or to characterize the mismatch with respect to a high precision positioning actuator setting.

An extra possibility is provided when a power detector is attached to the RF line behind the mismatch arrangement. The mismatch loss may then be calculated when applying a mismatch since the power without mismatch is known. With known mismatch loss it is easy to calculate the VSWR, enabling the test system to monitor itself.

Thus, the power detector in a test setup may also be used for measuring the mismatch loss, relative the power read with the mismatch arrangement set to zero. The mismatch loss can easily be recalculated to mismatch, in units of VSWR or return loss.

Thus, the arrangement in accordance with the present invention provides for an adjustable and easy characterized mismatch, which does not have to be disconnected after use, but simply set to zero. Once set to zero the mismatch arrangement will act as a through-line and may preferably be positioned right at the port of the DUT 10, having very limited influence on other measurements performed with other test equipment positioned behind the mismatch arrangement.

Further, the adjustable mismatch arrangement will be able to withstand high RF power, since no power loss will occur in the mismatch arrangement, since it only adds reactive mismatch. Behind the mismatch arrangement there will normally be a power terminating load 11, and the part of the RF energy that is not reflected back to the source in the mismatch arrangement will be terminated in that load 11.

Figure 5:
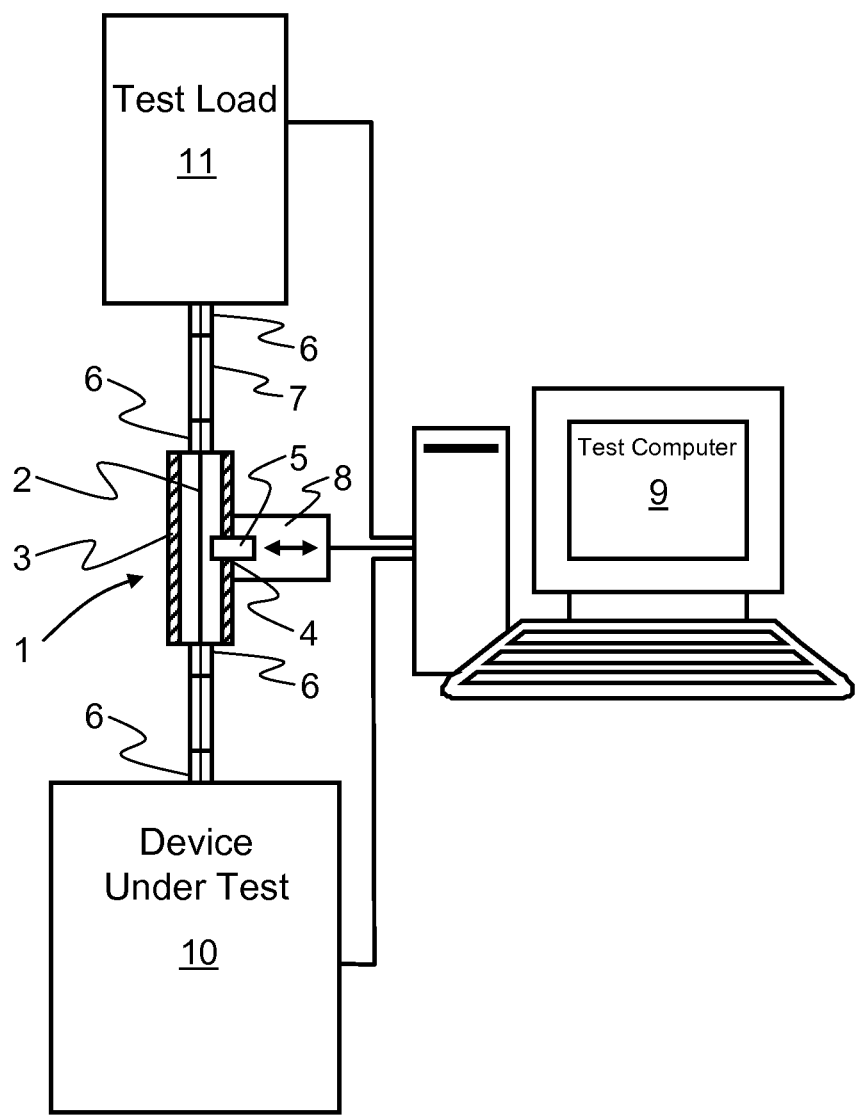
FIG. 5 illustrates a system for through-line mismatch RF testing comprising an arrangement for through-line mismatch RF testing according to the present invention.

Finally, in accordance with the present invention is also envisaged a system for through-line mismatch RF testing as illustrated in FIG. 5. The system comprises a device under test 10, a test load 11 and a test monitoring equipment 9, such as a test computer. The device under test 10 and the test load 11 are interconnected by an arrangement for through-line mismatch RF testing 1 as described above.

The cylinders 5 of the arrangement for through-line mismatch RF testing 1 are controlled by actuators 8, under control of the test monitoring equipment 9, to different positions of either protrusion from an inside of the shielding 3 towards the inner conductor 2 or aligned with the shielding 3 and such that no part thereof protrudes from the inside of the shielding 3.

The load 11, illustrated in FIG. 5, may optionally comprise measurement equipment, such as e.g. a power meter. Alternatively the load 11 may replaced by a power attenuator, connected to a power meter, which in turn is connected to the test monitoring equipment 9.

Thus, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

Expressions such as "including", "comprising", "incorporating", "consisting of", "have", "is" used to describe and claim the present invention are intended to be construed in a non-exclusive manner, namely allowing for items, components or elements not explicitly described also to be present. Reference to the singular is also to be construed to relate to the plural and vice versa.

Numerals included within parentheses in the accompanying claims are intended to assist understanding of the claims and should not be construed in any way to limit subject matter claimed by these claims.

The invention claimed is:

1. A method of facilitating through-line mismatch RF testing using an air-isolated coaxial line having an inner conductor surrounded by a coaxial shielding, the method comprising the steps of:
   providing at least one circular opening through said shielding;
   providing a corresponding radially adjustable piston in each said opening such that the piston is electrically connected to said shielding and such that a protrusion of the piston from an inside of said shielding towards said inner conductor is adjustable, wherein different amounts of protrusion of the piston towards the inner conductor create different levels of RF mismatch;
   pre-calibrating a known protrusion of the piston toward the inner conductor with a known amount of RF mismatch; and
   based on the pre-calibrating step, adjusting the piston to protrude toward the inner conductor by an amount calculated to create a desired level of RF mismatch.

2. The method according to claim 1, further comprising making the coaxial line a through-line by adjusting the adjustable piston to a position aligned with the inside of said shielding and such that no part of the piston protrudes from the inside of said shielding.

3. The method according to claim 2, further comprising the step of providing said radially adjustable piston with a curved surface facing said inner conductor, said curved surface being given essentially the same curvature as said inside of said shielding.

4. The method according to claim 1, further comprising the step of providing means for radial adjustment of said piston.

5. The method according to claim 4, further comprising the step of providing as said means for radial adjustment of said piston at least one of:
   a linear stepper motor;
   a plain DC motor with a suitable gearbox in combination with a position read-back device; and
   a similar actuator which is controllable to well defined positions.

6. The method according to claim 4, further comprising the steps of providing a predetermined stop for limiting said protrusion of said radially adjustable piston from said inside of said shielding towards said inner conductor, and providing as said means for radial adjustment of said piston at least one of:
   a mechanical actuator;
   an electro-magnetic actuator; and
   a pneumatic actuator.

7. The method according to claim 6, further comprising the step of providing said predetermined stop as an adjustable stop.

8. The method according to claim 7, further comprising the step of arranging said predetermined stop to be adjustable by means of at least one adjustment screw.

9. The method according to claim 1, further comprising the step of providing each said opening circumferentially spaced at a same longitudinal position of said coaxial line.

10. An arrangement for through-line mismatch RF testing comprising:
   an air-isolated coaxial line having an inner conductor surrounded by a coaxial shielding,
   at least one circular opening through said shielding; and
   a corresponding radially adjustable piston being provided in each said opening such that the piston is electrically connected to said shielding and such that a protrusion of the piston from an inside of said shielding towards said inner conductor is adjustable, wherein different amounts of protrusion of the piston towards the inner conductor create different levels of RF mismatch;
   wherein the arrangement is configured to:
      pre-calibrate a known protrusion of the piston toward the inner conductor with a known amount of RF mismatch; and
      based on the pre-calibrating step, adjust the piston to protrude toward the inner conductor by an amount calculated to create a desired level of RF mismatch.

11. The arrangement according to claim 10, wherein said radially adjustable piston is adjustable to a position aligned with said shielding and such that no part thereof protrudes from said inside of said shielding.

12. The arrangement according to claim 11, wherein said radially adjustable piston has a curved surface facing said inner conductor, said curved surface having essentially the same curvature as said inside of said shielding.

13. The arrangement according to claim 10, comprising means for radial adjustment of said piston.

14. The arrangement according to claim 13, wherein said means for radial adjustment of said piston comprises at least one of:
   a linear stepper motor;
   a plain DC motor with a suitable gearbox in combination with a position read-back device; and
   a similar actuator which is controllable to well defined positions.

15. The arrangement according to claim 13, wherein said protrusion of said radially adjustable piston from said inside of said shielding towards said inner conductor further being limited by a predetermined stop, and said means for radial adjustment of said piston comprising at least one of:
   a mechanical actuator;
   an electro-magnetic actuator; and
   a pneumatic actuator.

16. The arrangement according to claim 15, wherein said predetermined stop is adjustable.

17. The arrangement according to claim 16, wherein said predetermined stop is adjustable by means of at least one adjustment screw.

18. The arrangement according to claim 10, wherein each said opening is provided circumferentially spaced at a same longitudinal position of said coaxial line.

19. A system for through-line mismatch RF testing comprising:
   a device under test;
   a test load;
   a test monitoring equipment; and
   wherein said device under test and said test load are interconnected by an arrangement comprising:
      an air-isolated coaxial line having an inner conductor surrounded by a coaxial shielding;
      at least one circular opening through said shielding; and
      a corresponding radially adjustable piston being provided in each said opening such that the piston is electrically connected to said shielding and such that a protrusion of the piston from an inside of said shielding towards said inner conductor is adjustable, wherein different amounts of protrusion of the piston towards the inner conductor create different levels of RF mismatch;
   wherein the arrangement is configured to:
      pre-calibrate a known protrusion of the piston toward the inner conductor with a known amount of RF mismatch; and
      based on the pre-calibrating step, adjust the piston to protrude toward the inner conductor by an amount calculated to create a desired level of RF mismatch.

* * * * *